United States Patent [19]

Wu

[11] Patent Number: 6,096,611

[45] Date of Patent: Aug. 1, 2000

[54] METHOD TO FABRICATE DUAL THRESHOLD CMOS CIRCUITS

[75] Inventor: Shye-Lin Wu, Hsinchu, Taiwan

[73] Assignee: Texas Instruments - Acer Incorporated, Hsinchu, Taiwan

[21] Appl. No.: 09/042,352

[22] Filed: Mar. 13, 1998

[51] Int. Cl.[7] .................................................. H01L 21/265
[52] U.S. Cl. ........................................ 438/289; 438/527
[58] Field of Search ...................................... 438/510, 514, 438/527, 199, 218, 225, 227, 228, 174, 217, 289, 291, 163, 290, 194, FOR 168, FOR 187, FOR 205

[56] References Cited

U.S. PATENT DOCUMENTS

| | | |
|---|---|---|
| 5,091,324 | 2/1992 | Hsu et al. . |
| 5,393,677 | 2/1995 | Lien et al. . |
| 5,393,679 | 2/1995 | Yang . |
| 5,416,038 | 5/1995 | Hsue et al. . |
| 5,432,114 | 7/1995 | O . |
| 5,501,993 | 3/1996 | Borland . |
| 5,661,045 | 8/1997 | Manning et al. . |
| 5,698,458 | 12/1997 | Hsue et al. . |
| 5,702,988 | 12/1997 | Liang . |
| 5,736,415 | 4/1998 | Chang et al. . |
| 5,780,907 | 7/1998 | Ema et al. . |

OTHER PUBLICATIONS

Tadahiro Kuroda et al., A 0.9–V, 150–MHz, 10–mW, 4 mm$^2$, 2–D Discrete Cosin Transform Core Processor with Variable Threshold–Voltage (VT) Scheme, IEEE Journal of Solid–State Circuits, vol. 31, No. 11, Nov. 1996, pp. 1770–1777.

S. Thompson et al., Dual Threshold Voltages and Substrate Bias: Keys to High Performance, Low Power, 0.1 $\mu$m Logic Designs, 1997 Symposium on VLSI Technology Digest of Technical Papers, pp. 69 and 70.

Zongjian Chen et al., 0.18$\mu$m Dual Vt MOSFET Process and Energy–Delay Measurement, 1996 IEEE, pp. 851–854.

*Primary Examiner*—Savitri Mulpuri
*Attorney, Agent, or Firm*—Harness, Dickey & Pierce, P.L.C.

[57] ABSTRACT

The method for forming dual threshold circuits on a semiconductor substrate is provided. The semiconductor substrate has a first region, a second region, and a third region. The first region, the second region, and the third region are doped with first type dopants. Then the first region and the second region are doped with second type dopants. The second type dopants are opposite type dopants of the first type dopants. The semiconductor substrate can be performed with more steps to form transistors in the first region, the second region, and the third region.

7 Claims, 2 Drawing Sheets

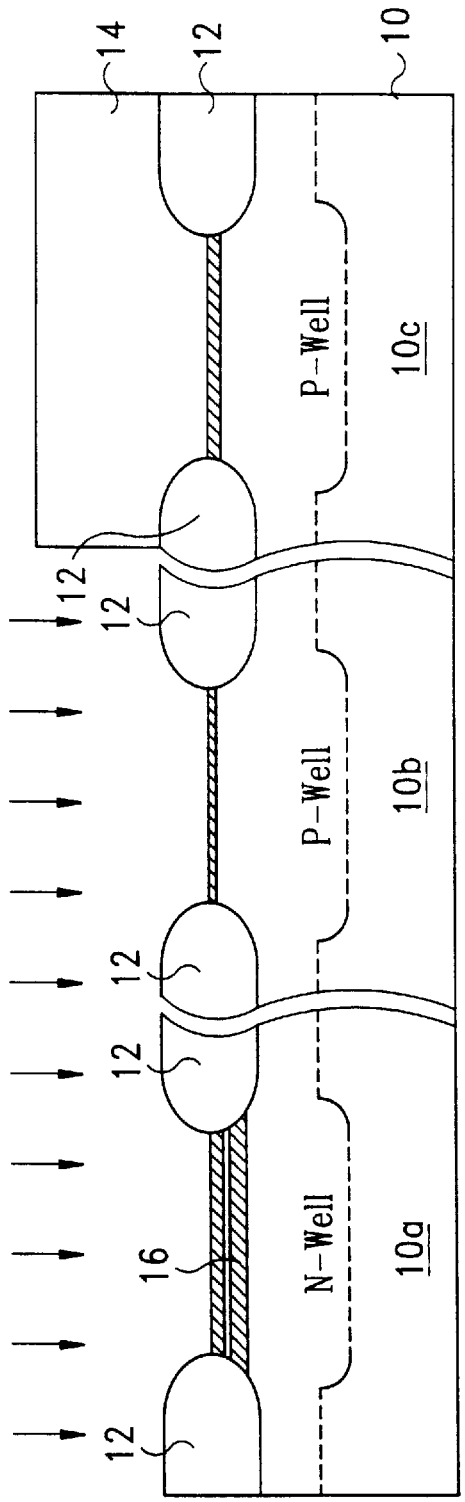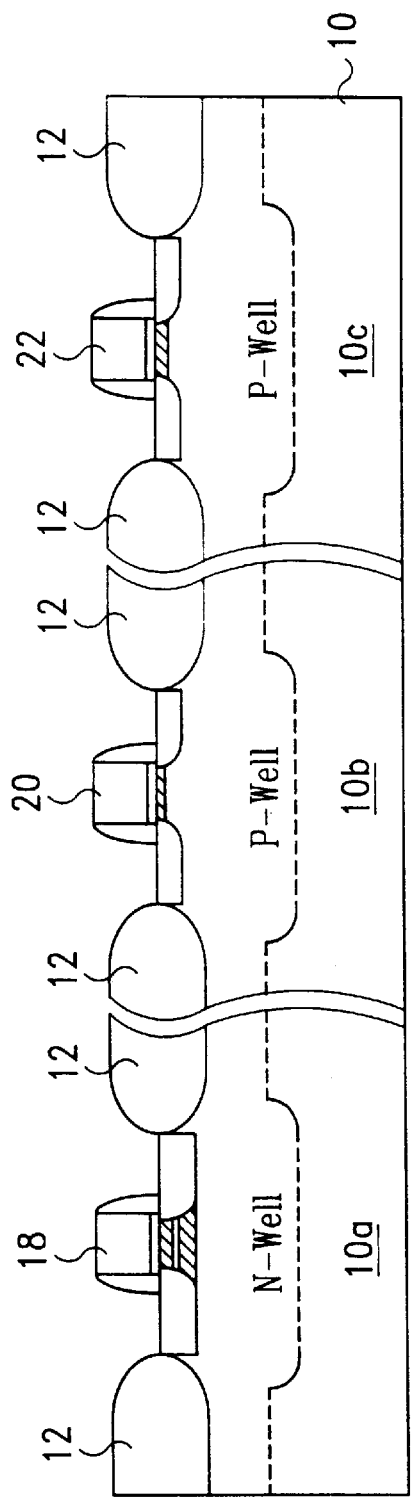

METHOD TO FABRICATE DUAL THRESHOLD CMOS CIRCUITS

FIELD OF THE INVENTION

The present invention relates semiconductor manufacturing processes, and more specifically, to a method for fabricating CMOS (complementary metal semiconductor oxide) circuits with dual threshold voltages.

BACKGROUND OF THE INVENTION

From the first invention of integrated circuits in 1960, the number of devices on a chip has grown in an explosive increasing rate. The technologies of the semiconductor industry has been researched continuously for almost four decades. The progress of the semiconductor integrated circuits has step into ULSI (ultra large scale integration) level or even higher level. The capacity of a single semiconductor chip increases from several thousand devices to hundreds of million devices, or even billions of devices. The integrated circuits devices like the transistors, the capacitors, and the connections must be greatly narrowed simultaneously.

The increasing packing density of the integrated circuits generates numerous challenges to the semiconductor manufacturing process. Every device needs to be formed within smaller size without damaging the characteristics and the operations. The demands on high packing density, and low heat generation devices with good reliability and long operation life must be maintained without any degradation in their functions. In more and more applications for portable and battery-operated devices like computer and communications systems, the low power consuming design is the main issue. Low power technologies in devices and manufacturing processes are highly required.

All the challenges and demands in fabrication are expected to be solved with the five key aspects of the semiconductor manufacturing, including the photography, the etching, the deposition, the ion implantation, and the thermal processing technologies. The continuous increase in the packing density of the integration circuits must be accompanied with a smaller feature size. In addition to chip area and functional considerations, all the devices with smaller size must be achieved with simplified or reduced manufacturing steps to raise the throughput and reduce the cost of products.

For the design of present stage devices, low threshold devices are expected for performance and power considerations especially in sub-micrometer and smaller size technologies. High threshold devices are also expected in the circuits to operate with reduced leakage current. Thus, integrated circuit chips with dual threshold devices have became one of the vital functional design. Dual threshold CMOS (complementary metal semiconductor oxide) circuits has been reported to provide better retention time in DRAM (dynamic random memory) design applications.

T. Kuroda et al. disclosed the characteristics of different approaches on dual threshold circuits and dynamic threshold circuits, in the work "A 0.9-V, 150-MHz, 10-mW, 4 mm$^2$, 2-D Discrete Cosine Transform Core Processor with Variable Threshold-Voltage (VT) Scheme" (in IEEE Journal of Solid-State Circuits, Vol. 31, No. 11, 1996). It is introduced that lowering both the supply voltage $V_{DD}$ and threshold voltage $V_{th}$ enables high-speed, low-power operation. However, the approach raises the problems of degradation of worst-case speed due to $V_{th}$ fluctuation in low $V_{DD}$ and the increase in the standby power dissipation in low $V_{th}$.

Several schemes in solving the problems are compared. A self-adjusting threshold voltage (SAT) scheme reduces Vth fluctuation in an active mode by adjusting substrate bias with a feedback control circuit. A standby power reduction (SPR) scheme raises $V_{th}$ in a standby mode by switching substrate bias between the power supply and an external additional supply higher than $V_{DD}$ or lower than GND. T. Kuroda et al. also introduced a dual or a multi threshold circuit for fast circuit operation and high $V_{th}$ for providing and cutting internal supply voltage. A circuit technique for dynamically varying threshold voltage ($V_T$ scheme) is disclosed the their work.

The benefits in improved retention time and reduced critical path delay of DRAM application has been illustrated by S. Thompson et al. (in the article "Dual Threshold Voltages and Substrate Bias: Keys to High Performance, Low Power, 0.1 $\mu$m Logic Designs", 1997 Symposium on VLSI Technology Digest of Technical Papers). The advantages of dual threshold devices in the applications of DRAM and static CMOS logic critical paths are disclosed. The reduced pass transistor leakage for improved DRAM retention time and reduced critical path delay through the use of a highly leaky low threshold device in static critical path circuits. It is shown in the work that dual threshold voltage devices and substrate bias are needed in high performance low power 0.1 micrometer logic designs.

In general, one or more additional masks are needed in conventional method for forming dual threshold circuits, in compared with single threshold circuits. Z. Chen et al. disclose a process in the work "0.18 $\mu$m Dual $V_t$ MOSFET Process and Energy-Delay Measurement" (in IEDM Tech. Dig., p. 851, 1996). They also disclosed that the challenge to maintain the performance and reduce the power consumption for battery operated applications has let to significant progress on low power technology and low power design. On the technology side, it has become gradually accepted that low threshold devices are vital for performance at low voltages. To overcome the issue of high leakage current associated with the low threshold devices, dual Vt processes are also realized. The objective is to use the low Vt devices for the few critical paths and high Vt devices for the non-critical paths. The process and measurement of dual Vt MOSFET are provided in the article.

For achieving dual threshold CMOS circuits, more efforts and masks are needed in the conventional process. What is highly demanded is a simplified reduced manufacturing process with reduced steps to raise the throughput and reduce the cost of products in fabricating dual threshold CMOS circuits.

SUMMARY OF THE INVENTION

A method to fabricate dual threshold CMOS circuits is disclosed in the present invention. The efforts and additional masks needed in the conventional process for achieving dual threshold CMOS circuits can be reduced. A simple process without any additional mask is provided.

The method for forming dual threshold circuits on a semiconductor substrate includes the following steps. The semiconductor substrate has a first region, a second region, and a third region. The first region, the second region, and the third region are doped with first type dopants. Then the first region and the second region are doped with second type dopants. The second type dopants are opposite type dopants of the first type dopants.

The semiconductor substrate can be performed with more steps to form transistors in the first region, the second region, and the third region. Thus the dual threshold CMOS circuits can be achieved.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein:

FIG. 3 illustrates a cross sectional view of doping second type dopants to the first region and the second region in accordance with the present invention.

FIG. 4 illustrates a cross sectional view of forming PMOS and NMOS transistors on the semiconductor substrate in accordance with the present invention.

DETAILED DESCRIPTION OF THE PREFERRED EMBODIMENT

The present invention provides a method to fabricate dual threshold CMOS circuits. With the method disclosed in the present invention, the additional masks needed in the conventional process for forming dual threshold CMOS circuits can be reduced. A step of doping first type dopants is performed. Another step of doping second type dopants is then applied to compensate the first dopants in a region for low threshold voltage devices. An easier process is provided for reducing manufacturing efforts.

The method and the steps in the present invention applied on a semiconductor wafer can create several regions with two different threshold voltage with reduced masks. For a clear illustration, the steps for forming mainly a region for PMOS device, a region for low threshold NMOS device, and a region for high threshold voltage device are illustrated. Upon acknowledging the method of the present invention, a person skilled in the art can employ the same spirit to form other combination of regions with different threshold voltage. The variations are not illustrated in detail.

Figure 1:
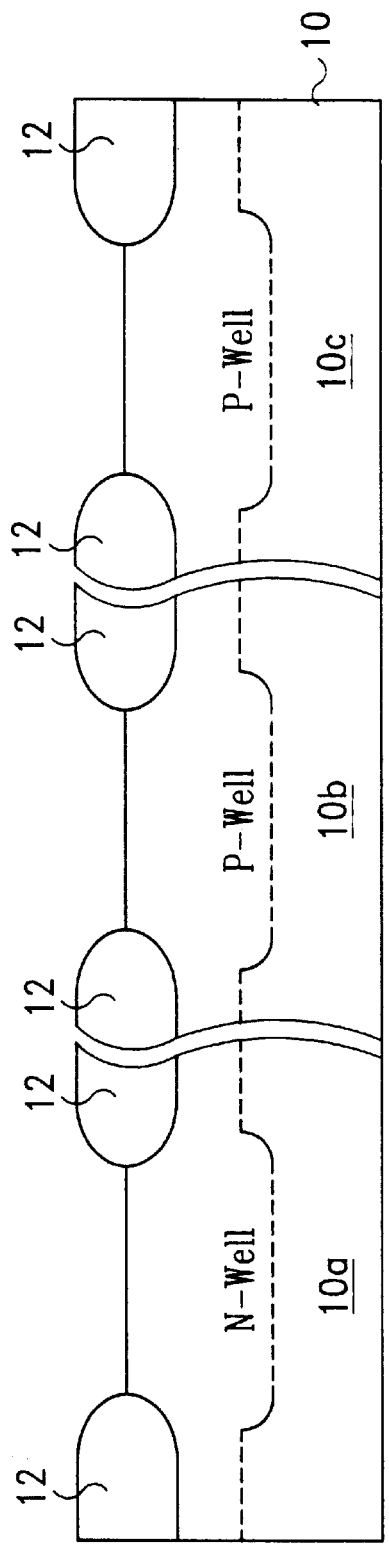
FIG. 1 illustrates a cross sectional view of a semiconductor substrate having a first region, a second region, and a third region in accordance with the present invention.

Referring to FIG. 1, a semiconductor substrate 10 is provided. In general, a silicon substrate with a preferable single crystalline silicon in <100> direction can be used as the semiconductor substrate 10. The semiconductor substrate 10 has a first region 10a, a second region 10b, and a third region 10c. In the embodiments, the first region 10a is PMOS device region, the second region 10b is low threshold voltage NMOS device region, and the third region 10c is high threshold voltage NMOS device region.

The semiconductor substrate 10 is provided with isolation region 12 formed between the a first region 10a, a second region 10b, and a third region 10c. The isolation region 12 can use field oxide isolation as indicated. Other isolation technologies like trench isolation can also be employed alternatively. The wells of opposite types in the three regions are also formed. The PMOS device region 10a has a N-well. The low threshold voltage NMOS device region 10b and the high threshold voltage NMOS device region 10c have P-wells. In general, a retrograde twin well structure is provided. The wells can be formed with conventional doping or implantation process and the details are not illustrated.

Figure 2:
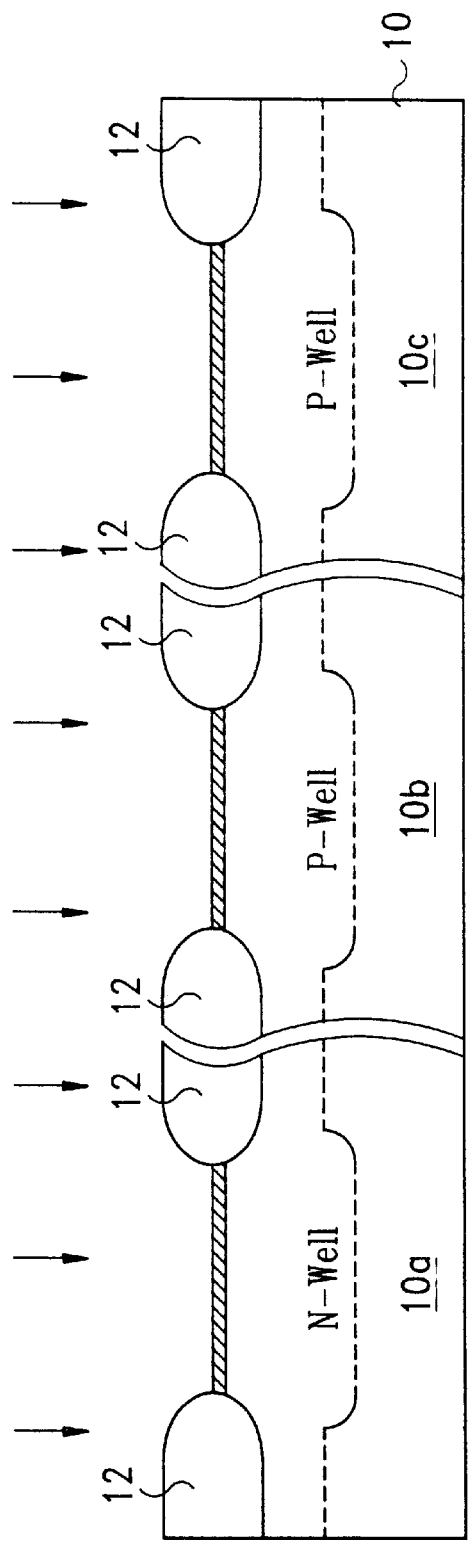
FIG. 2 illustrates a cross sectional view of doping first type dopants to the first region, the second region, and the third region in accordance with the present invention.

Turning to FIG. 2, a doping process is performed to dope the first region 10a, the second region 10b, and the third region 10c with first type dopants. As an example, a blanket ion implantation process can be used to implant ions into all the three regions of the semiconductor substrate 10 at the same time. The implantation is performed at an energy between about 5 KeV to 150 KeV. In the case, the first type dopants can be boron containing dopants or $BF_2$ dopants. To adjust the threshold voltage of the low threshold voltage NMOS device region 10b and the high threshold voltage NMOS device region 10c, the first type dopants are doped at a dose between about 1E11 atoms/cm$^2$ to about 1E14 atoms/cm$^2$.

Referring to FIG. 3, another doping process is performed to dope the first region 10a and the second region 10b with second type dopants. The second implants are implanted for PMOS device anti-punchthrough stopping in the first region 10a, and for adjusting the threshold voltage of NMOS device in the second region 10b. As an example, an ion implantation process can be used to implant ions into the first region 10a and the second region 10b of the semiconductor substrate 10.

For preventing the third region 10c from being implanted, a shield layer 14 is formed over the third region 10c. In general, a photoresist layer can be used as the shield layer 14. In the embodiments, the photoresist layer 14 is formed on the semiconductor substrate 10 at first. Then a lithography process is employed to transfer a pattern on a mask onto the photoresist layer 14 by exposure. After the photoresist layer 14 is developed, a portion of the photoresist layer 14 is removed and the remained portion is left over the third region 10c, as indicated in FIG. 3.

The implantation of second type dopants is performed at an energy between about 20 KeV to 200 KeV. The second type dopants are chosen to be opposite type dopants to the first type dopants. In the case, the second type dopants can be phosphorus dopants or phosphorus containing dopants. To adjust the threshold voltage of the low threshold voltage NMOS device region 10b, the first type dopants are doped at a dose between about 1E12 atoms/cm$^2$ to about 5E14 atoms/cm$^2$. The first type dopants in the second region 10b is compensated by the second type dopants and thus the threshold voltage of the region is reduced to serve as a low threshold voltage NMOS device region. In the first region 10a, the second type can penetrate deeper in the N-well and an anti-punchthrough region 16 is formed.

With the above steps, the semiconductor substrate 10 with the threshold voltage adjusted for the low threshold voltage NMOS device region 10b and the high threshold voltage NMOS device region 10c is achieved. The PMOS device 10a is also formed with anti-punchthrough stopping region 16. The semiconductor substrate 10 with adjusted threshold is then performed with a series of steps to form the transistors, or more specifically PMOS and NMOS transistors to make dual threshold voltage CMOS circuits. Referring to FIG. 4, PMOS transistors 18 and NMOS transistors 20 and 22 are formed respectively on the PMOS device region 10a, the low threshold voltage NMOS device region 10b, and the high threshold voltage NMOS device region 10c.

The present invention disclosed a method to fabricate dual threshold CMOS circuits. By the compensating the first type dopants in the second region 10b by the second type dopants, the mask needed in the conventional process can be reduced. The PMOS device region 10a is also formed with anti-punchthrough stopping. The dual threshold CMOS circuits can be easily made without additional mask. The method proposed in the invention makes the fabrication process easier and simpler. The cost of the process can be reduced and the throughput can be raised with minimized efforts.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A method for forming dual threshold circuits on a semiconductor substrate, said semiconductor substrate having a first region, a second region, and a third region, said first region, said second region, and said third region being separated by an isolation region therebetween, said method comprising the steps of:

doping by blanket implantation said first region, said second region, and said third region with first type dopants; and doping by on ion implantation said first region and said second region with second type dopants, with a photoresist layer covered over said third region, said second type dopants being opposite type dopants of said first type dopants, where second type dopants have a higher concentration than that of said first type dopants, wherein said first region is a PMOS device region, said second region is a low threshold voltage NMOS device region, and said third region is a high threshold voltage NMOS device region.

2. The method of claim 1, wherein said step of doping said first type dopants is performed at an energy between about 5 KeV to 150 KeV.

3. The method of claim 1, wherein said first type dopants comprise boron containing dopants or $BF_2$ dopants.

4. The method of claim 1, wherein said first type dopants are doped at a dose between about 1E11 atoms/cm$^2$ to about 1E14 atoms/cm$^2$.

5. The method of claim 1, wherein said step of doping said second type dopants is performed with ion implantation at an energy between about 20 KeV to 200 KeV.

6. The method of claim 1, wherein said second type dopants comprise phosphorus containing dopants.

7. The method of claim 1, wherein said second type dopants are doped at a dose between about 1E12 atoms/cm$^2$ to about 5E14 atoms/cm$^2$.

* * * * *